(12) United States Patent
Matsui

(10) Patent No.: US 12,014,929 B2
(45) Date of Patent: Jun. 18, 2024

(54) ETCHING METHOD FOR SILICON NITRIDE AND PRODUCTION METHOD FOR SEMICONDUCTOR ELEMENT

(71) Applicant: SHOWA DENKO K.K., Tokyo (JP)

(72) Inventor: Kazuma Matsui, Tokyo (JP)

(73) Assignee: Resonac Corporation, Tokyo (JP)

( * ) Notice: Subject to any disclaimer, the term of this patent is extended or adjusted under 35 U.S.C. 154(b) by 90 days.

(21) Appl. No.: 17/595,351

(22) PCT Filed: Oct. 12, 2020

(86) PCT No.: PCT/JP2020/038518
§ 371 (c)(1),
(2) Date: Nov. 15, 2021

(87) PCT Pub. No.: WO2021/079780
PCT Pub. Date: Apr. 29, 2021

(65) Prior Publication Data
US 2022/0216062 A1 Jul. 7, 2022

(30) Foreign Application Priority Data
Oct. 25, 2019 (JP) .................................. 2019-194723

(51) Int. Cl.
*H01L 21/311* (2006.01)
*H01L 21/306* (2006.01)

(52) U.S. Cl.
CPC .. *H01L 21/30604* (2013.01); *H01L 21/31111* (2013.01)

(58) Field of Classification Search
None
See application file for complete search history.

(56) References Cited

U.S. PATENT DOCUMENTS

| 5,534,107 | A | * | 7/1996 | Gray | ................. | H01L 21/02063 |
| | | | | | | 257/E21.258 |
| 9,524,877 | B2 | | 12/2016 | Kikuchi et al. | | |
| 10,079,150 | B2 | * | 9/2018 | Neumann, Jr. | ..... | H01L 21/3065 |
| 2004/0069747 | A1 | * | 4/2004 | Patel | ................. | H01J 37/32963 |
| | | | | | | 216/59 |

(Continued)

FOREIGN PATENT DOCUMENTS

| EP | 0 697 715 A1 | 2/1996 |
| JP | 4-10621 A | 1/1992 |

(Continued)

OTHER PUBLICATIONS

D. E. Ibbotson, et al. (Plasmaless dry etching of silicon with fluorine-containing compounds ); J. Appl. Phys. 56 (1 0), Nov. 15, 1984; p. 2939-2942. (Year: 1984).*

(Continued)

*Primary Examiner* — Shamim Ahmed
(74) *Attorney, Agent, or Firm* — Sughrue Mion, PLLC

(57) ABSTRACT

There is provided an etching method for silicon nitride that enables selective etching of silicon nitride without using plasma. The etching method for silicon nitride includes placing etching object (12) containing silicon nitride in an etching gas containing halogen fluoride, which is a compound of bromine or iodine and fluorine, to etch the silicon nitride of the etching object (12) without using plasma under a pressure of 1 Pa to 80 kPa.

8 Claims, 1 Drawing Sheet

(56) References Cited

U.S. PATENT DOCUMENTS

| | | | |
|---|---|---|---|
| 2016/0005612 A1 | 1/2016 | Kikuchi et al. | |
| 2017/0200602 A1* | 7/2017 | Kikuchi | H01L 31/18 |
| 2018/0251679 A1 | 9/2018 | Takahashi et al. | |
| 2018/0286707 A1* | 10/2018 | Hudson | H01J 37/3244 |
| 2019/0115365 A1* | 4/2019 | Han | H10B 43/35 |
| 2019/0287808 A1* | 9/2019 | Goradia | H01J 37/32422 |
| 2019/0355590 A1* | 11/2019 | Suzuki | H01L 21/32135 |

FOREIGN PATENT DOCUMENTS

| | | |
|---|---|---|
| JP | WO 2016/056300 A1 | 4/2016 |
| JP | 6032033 B2 | 11/2016 |
| TW | 201442111 A | 11/2014 |
| WO | 2016/181723 A1 | 11/2016 |

OTHER PUBLICATIONS

International Preliminary Report on Patentability dated Apr. 26, 2022 with a Translation of the Written Opinion of the International Searching Authority in Application No. PCT/JP2020/038518.

International Search Report dated Nov. 2, 2020, issued by the International Searching Authority in application No. PCTJP2020/038518.

* cited by examiner

ETCHING METHOD FOR SILICON NITRIDE AND PRODUCTION METHOD FOR SEMICONDUCTOR ELEMENT

CROSS REFERENCE TO RELATED APPLICATIONS

This application is a National Stage of International Application No. PCT/JP2020/038518 filed Oct. 12, 2020, claiming priority based on Japanese Patent Application No. 2019-194723 filed Oct. 25, 2019.

TECHNICAL FIELD

The present invention relates to an etching method for silicon nitride and a production method for a semiconductor element.

BACKGROUND ART

Etching is used for patterning or removing silicon nitride in a semiconductor manufacturing process. For example, PTL 1 discloses a method of selectively etching silicon nitride against silicon oxide by using a plasma gas obtained by transforming a dry etching agent that contains 1,3,3,3-tetrafluoropropene into a plasma state. However, the etching method using plasma has a problem of high cost.

CITATION LIST

Patent Literature

PTL 1: WO 2016/181723
PTL 2: Japanese Patent No. 6032033
PTL 3: WO 2016/056300

SUMMARY OF INVENTION

Technical Problem

As etching methods that do not use plasma (hereinafter may be referred to as "plasmaless etching methods" or "plasmaless etching"), for example, PTL 2 discloses an etching method for polysilicon films using iodine heptafluoride ($IF_7$). Further, PTL 3 discloses an etching method for a silicon compound using an etching gas composition containing halogen fluoride such as chlorine monofluoride (ClF) as a main component.

However, silicon nitride has been mentioned as a mask material in PTL 2, and it has been suggested that silicon nitride is not etched by the plasmaless etching method disclosed in PTL 2. In addition, the plasmaless etching method disclosed in PTL 3 is a method for selectively etching silicon oxide against silicon nitride, and it has not been disclosed that silicon nitride is selectively etched.

An object of the present invention is to provide an etching method for silicon nitride that enables selective etching of silicon nitride without using plasma.

Solution to Problem

To solve the above-described problems, one aspect of the present invention is as follows [1] to [11].

[1] An etching method for silicon nitride, placing an etching object containing silicon nitride in an etching gas containing halogen fluoride, the halogen fluoride being a compound of bromine or iodine and fluorine, to etch the silicon nitride of the etching object under a pressure of 1 Pa to 80 kPa without using plasma.

[2] The etching method for silicon nitride according to [1], wherein the content of hydrogen fluoride contained in the etching gas is below 100 ppm by volume.

[3] The etching method for silicon nitride according to [1] or [2], wherein a temperature of the etching object is 155° C. to 500° C.

[4] The etching method for silicon nitride according to any one of [1] to [3], wherein the content of the halogen fluoride contained in the etching gas is equal to or more than 1% by volume.

[5] The etching method for silicon nitride according to any one of [1] to [4], wherein the etching gas is a gas composed of only the halogen fluoride, or a mixed gas composed of the halogen fluoride and an inert gas.

[6] The etching method for silicon nitride according to [5], wherein the inert gas is at least one selected from among nitrogen gas, helium, argon, neon, krypton, and xenon.

[7] The etching method for silicon nitride according to any one of [1] to [6], wherein the halogen fluoride is at least one selected from among bromine trifluoride, bromine pentafluoride, iodine pentafluoride, and iodine heptafluoride.

[8] The etching method for silicon nitride according to any one of [1] to [7], wherein the etching object contains the silicon nitride and an etching-resistant material configured to suppress etching of the silicon nitride by the etching gas, and the silicon nitride of the etching object is selectively etched by the etching gas.

[9] The etching method for silicon nitride according to [8], wherein the etching-resistant material contains at least one selected from among silicon dioxide, photoresist, and amorphous carbon.

[10] The etching method for silicon nitride according to [8] or [9], wherein an etching selectivity ratio is 10 or more, the etching selectivity ratio being a ratio of an etching rate of the silicon nitride to an etching rate of the etching-resistant material.

[11] A production method for a semiconductor element for producing a semiconductor element by using the etching method for silicon nitride according to any one of [1] to [10].

Advantageous Effects of Invention

According to the present invention, silicon nitride can be selectively etched without using plasma.

DESCRIPTION OF EMBODIMENTS

Figure 1:
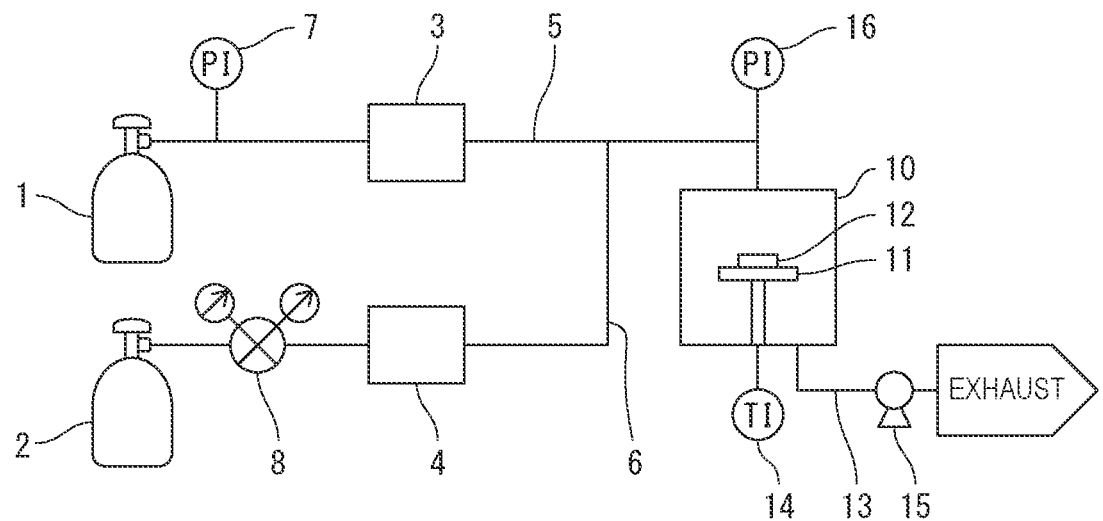
FIG. 1 is a schematic diagram of an example of an etching apparatus illustrative of an embodiment of the etching method for silicon nitride in accordance with the present invention.

An embodiment of the present invention will be described below. The present embodiment illustrates an example of the present invention, and the present invention is not limited to the present embodiment. Further, various changes or improvements can be added to the present embodiment, and forms with such changes or improvements added thereto can be included in the present invention.

An etching method for silicon nitride of the present embodiment includes placing an etching object containing silicon nitride ($Si_3N_4$ or the like) in an etching gas containing halogen fluoride, which is a compound of bromine or iodine and fluorine, and etch the silicon nitride of the etching object under a pressure of 1 Pa to 80 kPa without using plasma.

Since silicon nitride can be selectively etched without using plasma, there is no need to perform etching by using a costly plasma generator. Consequently, silicon nitride can be etched at lower cost. Further, since plasma is not used, corrosion of the members constituting an etching apparatus and the piping connected to the etching apparatus is less likely to occur.

Etching in the present invention mainly means processing an etching object into a predetermined shape (e.g., a three-dimensional shape) by removing a part or all of the silicon nitride contained in the etching object (e.g., processing a silicon nitride film of the etching object to a predetermined film thickness), and also cleaning by removing residues and deposits composed of silicon nitride from the etching object.

The etching method for silicon nitride of the present embodiment described above can be used for manufacturing semiconductor elements such as 3D-NAND flash memories. For example, by applying the etching method for silicon nitride of the present embodiment to a stack in which silicon dioxide films and silicon nitride films are alternately stacked and a through hole is formed, extending along the stacking direction and penetrating through the stack (refer to FIG. 2), the silicon nitride films exposed on the inner surface of the through hole are selectively and isotropically etched. This makes it possible to form a structure in which the edges of the silicon dioxide films protrude into the through hole. The process of forming a structural substance with such a structure can be used for manufacturing semiconductor elements such as 3D-NAND flash memories, because the structural substance can be used as the structural substance of a semiconductor element.

The process of forming the above structure by etching has conventionally been carried out using a chemical solution containing phosphoric acid or the like. However, etching using an etching gas is superior to etching using a chemical solution in terms of microfabrication performance. For this reason, the etching method for silicon nitride of the present embodiment can be expected to contribute to further miniaturization and integration of semiconductor elements.

Further, also when an etching-resistant material itself, which will be described later, is used as the structural substance of a semiconductor element, a material that does not substantially react with halogen fluoride or a material that reacts extremely slowly with halogen fluoride is used as the etching-resistant material. More specifically, at least one material selected from among, for example, silicon dioxide ($SiO_2$), photoresist, and amorphous carbon can be used.

Further, as described above, the etching method for silicon nitride of the present embodiment can also be used for cleaning. For example, after performing a step of depositing a film made of a material containing silicon nitride on a substrate or a step of etching a film made of a material containing silicon nitride formed on a substrate in a chamber, deposits containing silicon nitride adhering to the inner surface of the chamber can be removed and cleaned by the etching method for silicon nitride of the present embodiment.

The following will describe in further detail the etching method for silicon nitride of the present embodiment.

[Etching Gas]

An etching gas is a gas containing halogen fluoride, which is a compound of bromine or iodine and fluorine. Although the type of halogen fluoride is not particularly limited as long as it is a compound of bromine or iodine and fluorine, at least one selected from among bromine monofluoride (BrF), bromine trifluoride ($BrF_3$), bromine pentafluoride ($BrF_5$), iodine pentafluoride ($IF_5$), and iodine heptafluoride ($IF_7$) is preferable. Among these halogen fluorides, at least one selected from among bromine trifluoride, bromine pentafluoride, iodine pentafluoride, and iodine heptafluoride is more preferable from the viewpoint of ease of handling and availability.

The etching gas may be a gas composed of only halogen fluoride, or a mixed gas containing halogen fluoride and another type of gas. If the etching gas is composed of a mixed gas containing halogen fluoride and another type of gas, then the content of the halogen fluoride contained in the etching gas is preferably 1% by volume or more, more preferably 5% by volume or more, and even more preferably 10% by volume or more.

If the etching gas is a mixed gas containing halogen fluoride and another type of gas, an inert gas can be used as another type of gas. In other words, the etching gas may be a mixed gas composed of halogen fluoride and an inert gas. As the inert gas, at least one selected from among nitrogen gas ($N_2$), helium (He), neon (Ne), argon (Ar), krypton (Kr), and xenon (Xe) can be used. The content of an inert gas contained in the etching gas is not particularly limited, but may be more than 0% by volume and 99% by volume or less.

Further, the content of hydrogen fluoride contained in an etching gas is preferably below 100 ppm by volume, and more preferably below 50 ppm by volume. If the content of hydrogen fluoride is below 100 ppm by volume, an etching selectivity ratio, which is a ratio of the etching rate of silicon nitride to the etching rate of the etching-resistant material to be described later, tends to be high.

[Etching Pressure]

The etching method for silicon nitride of the present embodiment includes placing an etching object in an etching gas to etch the silicon nitride of the etching object without using plasma. The etching is performed under a pressure of 1 Pa to 80 kPa.

For example, an etching object can be placed in a chamber and etching can be performed while circulating an etching gas in the chamber. The pressure in the chamber during the circulation of the etching gas is 1 Pa to 80 kPa. The flow rate of the etching gas may be appropriately set such that the pressure in the chamber is maintained constant according to the size of the chamber and the capability of an exhaust system for depressurizing the inside of the chamber.

[Temperature During Etching]

The etching method for silicon nitride of the present embodiment includes placing an etching object in an etching gas to etch the silicon nitride of the etching object without using plasma. The etching is preferably performed with the temperature of the etching object set at a temperature of 155° C. to 500° C.

If the temperature of an etching object is 155° C. or more, then halogen fluoride can exist in a gaseous state, and the etching rate of the silicon nitride tends to become higher. The temperature of the etching object is preferably 170° C. or more, more preferably 200° C. or more, and even more preferably 250° C. or more. On the other hand, setting the temperature of the etching object to 500° C. or less is advantageous in that, for example, an etching object can be heated without requiring excessive time and energy, equipment and members used for etching are less likely to be damaged, and an etching-resistant material is less likely to be etched.

Halogen fluoride hardly reacts with etching-resistant materials such as a silicon dioxide and a photoresist under conditions that do not generate plasma and at a temperature of 500° C. or less. Therefore, if an etching object has both an etching-resistant material and silicon nitride, then using the etching method for silicon nitride of the present embodiment makes it possible to selectively etch the silicon nitride while hardly etching the etching-resistant material. Consequently, the etching method for silicon nitride of the present embodiment can be used for methods such as processing silicon nitride into a predetermined shape by using a patterned etching-resistant material as a mask.

Further, if the temperature of an etching object is 500° C. or less, then the etching selectivity tends to be high. For example, the etching selectivity ratio, which is the ratio of the etching rate of silicon nitride to the etching rate of an etching-resistant material to be described later, tends to be 10 or more.

The upper limit value of the temperature of the etching object is preferably 500° C. or less, more preferably 450° C. or less, and even more preferably 350° C. or less.

[Etching Object]

An etching object, which is to be etched by the etching method for silicon nitride of the present embodiment, contains silicon nitride. In other words, the etching object may be a member formed only of silicon nitride, a member having a portion formed only of silicon nitride and a portion formed of another material, or a member formed of a mixture of silicon nitride and another material.

The silicon nitride refers to a compound having substantially only silicon and nitrogen in an optional proportion, and examples thereof include $Si_3N_4$. Although the purity of silicon nitride is not particularly limited, the purity is preferably 30% by mass or more, more preferably 60% by mass or more, and even more preferably 90% by mass or more. The shape of an entire etching object or the shape of a portion of the etching object that is formed only of silicon nitride is not particularly limited, and the etching object may be in the form of, for example, foil, film, powder, or lump.

If an etching object is a member that has a portion formed only of silicon nitride and a portion formed of another material, or a member formed of a mixture of silicon nitride and another material, then another material mentioned above may be an etching-resistant material that suppresses etching of silicon nitride by an etching gas. In other words, if the etching object contains silicon nitride and an etching-resistant material that suppresses etching of silicon nitride by an etching gas, then the etching-resistant material is used as a mask, and the silicon nitride in the etching object is selectively etched by using an etching gas.

There is no particular restriction on etching-resistant materials as long as the materials do not substantially react with halogen fluoride, or react extremely slowly with halogen fluoride, and can suppress etching of silicon nitride by an etching gas. Etching-resistant materials include, for example, silicon dioxide, photoresist, amorphous carbon, metals such as nickel and cobalt, and oxides and nitrides of these metals. Among these, silicon dioxide, photoresist, and amorphous carbon are more preferable from the viewpoint of ease of handling and availability.

The photoresist means a photosensitive composition whose physical properties, including solubility, are changed by light, an electron beam, or the like. Examples include photoresists for g-line, h-line, i-line, KrF, ArF, F2, and EUV. There is no particular restriction on the composition of the photoresist as long as the composition is generally used in semiconductor manufacturing processes, and examples include compositions containing a polymer synthesized from at least one monomer selected from among chain olefins, cyclic olefins, styrene, vinyl phenol, acrylic acid, methacrylate, epoxy, melamine, and glycol.

Referring now to FIG. 1, an example of the configuration of an etching apparatus and an example of the etching method for silicon nitride that uses the etching apparatus will be described. The etching apparatus of FIG. 1 is a plasmaless etching apparatus that does not use plasma. First, the etching apparatus of FIG. 1 will be described.

The etching apparatus of FIG. 1 includes a chamber 10 in which etching is performed therein, a stage 11 that supports an etching object 12 to be etched inside the chamber 10, a thermometer 14 that measures the temperature of the etching object 12, an exhaust pipe 13 for discharging a gas inside the chamber 10, a vacuum pump 15 provided on the exhaust pipe 13 to depressurize the inside of the chamber 10, and a pressure gauge 16 that measures the pressure inside the chamber 10.

The etching apparatus of FIG. 1 further includes an etching gas supply unit that supplies an etching gas into the chamber 10. This etching gas supply unit has a halogen fluoride gas supply unit 1 that supplies a halogen fluoride gas, an inert gas supply unit 2 that supplies an inert gas, a halogen fluoride gas supply pipe 5 that connects the halogen fluoride gas supply unit 1 and the chamber 10, and an inert gas supply pipe 6 that connects the inert gas supply unit 2 to a middle part of the halogen fluoride gas supply pipe 5.

Further, the halogen fluoride gas supply pipe 5 is provided with a pressure gauge 7 that measures the pressure of a halogen fluoride gas, and a halogen fluoride gas flow rate control unit 3 that controls the flow rate of a halogen fluoride gas. In addition, the inert gas supply pipe 6 is provided with an inert gas pressure control unit 8 that controls the pressure of an inert gas, and an inert gas flow rate control unit 4 that controls the flow rate of an inert gas.

Further, to supply the halogen fluoride gas as the etching gas to the chamber 10, the halogen fluoride gas is fed out from the halogen fluoride gas supply unit 1 to the halogen fluoride gas supply pipe 5, thereby supplying the halogen fluoride gas to the chamber 10 through the halogen fluoride gas supply pipe 5.

Further, to supply a mixed gas of a halogen fluoride gas and an inert gas as the etching gas, the halogen fluoride gas is fed out from the halogen fluoride gas supply unit 1 to the halogen fluoride gas supply pipe 5 and the inert gas is fed out from the inert gas supply unit 2 to the halogen fluoride gas supply pipe 5 through the inert gas supply pipe 6. Thus, the halogen fluoride gas and the inert gas are mixed to make a mixed gas at the middle part of the halogen fluoride gas supply pipe 5, and the mixed gas is supplied to the chamber 10 through the halogen fluoride gas supply pipe 5.

There is no particular restriction on the configurations of the halogen fluoride gas supply unit 1 and the inert gas supply unit 2, and for example, a tank or a cylinder may be used. In addition, as the halogen fluoride gas flow rate control unit 3 and the inert gas flow rate control unit 4, a mass flow controller or a flow meter, for example, can be used.

While supplying an etching gas to the chamber 10, the supply pressure (i.e., the value on the pressure gauge 7 in FIG. 1) of the etching gas is preferably maintained at a predetermined value. More specifically, the supply pressure of the etching gas is preferably 1 kPa to 1.0 MPa, more preferably 10 kPa to 0.5 MPa, and even more preferably 30 kPa to 0.3 MPa. If the supply pressure of the etching gas remains within the above range, the etching gas is smoothly supplied to the chamber 10 and the load on the components (e.g., the various units and the pipes) of the etching apparatus of FIG. 1 is small.

Further, the pressure of an etching gas supplied into the chamber 10 needs to be 1 Pa to 80 kPa, and is preferably 5 Pa to 50 kPa from the viewpoint of uniformly etching the surface of the etching object 12. If the pressure of the etching gas in the chamber 10 is within the above range, a sufficient etching rate can be obtained and the etching selectivity ratio tends to be high.

The pressure in the chamber 10 before an etching gas is supplied is not particularly limited as long as the pressure is equal to or lower than the supply pressure of the etching gas, or lower than the supply pressure of the etching gas, but is preferably, for example, equal to or higher than $10^{-5}$ Pa and below 10 kPa, and more preferably 1 Pa to 2 kPa.

The pressure difference between the supply pressure of an etching gas and the pressure in the chamber 10 before the etching gas is supplied is preferably 1.0 MPa or lower, more preferably 0.5 MPa or lower, and even more preferably 0.3 MPa or lower. If the pressure difference is within the above range, the etching gas is likely to be smoothly supplied into the chamber 10.

While an etching gas is being supplied into the chamber 10, the temperature of the etching gas is preferably maintained at a predetermined value. More specifically, the supply temperature of the etching gas is preferably 10° C. to 150° C.

The temperature of the etching object 12 during etching is preferably set to 155° C. to 500° C. Within this temperature range, the etching of silicon nitride is likely to smoothly proceed, and the load on the etching apparatus is small, which tends to prolong the life of the etching apparatus.

The processing time of etching (hereinafter also referred to as "etching time") can be optionally set depending on how much silicon nitride is to be etched, but is preferably within 60 minutes, more preferably within 40 minutes, and even more preferably within 30 minutes in consideration of the production efficiency of a semiconductor element manufacturing process. The processing time of etching refers to the time from the introduction of an etching gas into the chamber 10 to the exhaustion of the etching gas inside the chamber 10 to complete the etching.

The etching method for silicon nitride of the present embodiment can be performed using a general plasmaless etching apparatus used in a semiconductor element manufacturing process, such as the etching apparatus of FIG. 1, and the configuration of the etching apparatus that can be used is not particularly limited.

For example, the positional relationship between the halogen fluoride gas supply pipe 5 and the etching object 12 is not particularly limited as long as an etching gas can be brought into contact with the etching object 12. Further, as for the configuration of a temperature control mechanism of the chamber 10, the temperature control mechanism may be directly installed on the stage 11, or an external temperature controller may be used to heat or cool the chamber 10 from outside the chamber 10 as long as the temperature of the etching object 12 can be adjusted to any temperature.

In addition, the material of the etching apparatus of FIG. 1 is not particularly limited as long as the material is corrosion resistant to halogen fluoride to be used and allows depressurization to a predetermined pressure. For example, metals such as nickel, nickel-based alloys, aluminum, stainless steel, and platinum, ceramics such as alumina, or fluoropolymers, or the like can be used for portions to be in contact with an etching gas. Specific examples of the nickel-based alloys include Inconel (registered trademark), Hastelloy (registered trademark), and Monel (registered trademark). In addition, examples of fluororesins include polytetrafluoroethylene (PTFE), polychlorotrifluoroethylene (PCTFE), tetrafluoroethylene/perfluoroalkoxyethylene copolymer (PFA), polyvinylidene fluoride (PVDF), Teflon (registered trademark), Viton (registered trademark), and Kalrez (registered trademark).

EXAMPLES

The following will describe the present invention in more detail, showing examples and comparative examples.

Example 1

An etching object was etched by using an etching apparatus having substantially the same configuration as that of the etching apparatus of FIG. 1. The etching object is a square silicon substrate of 2 inches per side which has a silicon nitride film with a film thickness of 1014 nm deposited thereon, and manufactured by KST World Corporation.

The etching object was placed on a stage inside a chamber of the etching apparatus, and the temperature of the stage was increased to 155° C. Subsequently, a bromine pentafluoride gas of a flow rate of 50 mL/min and argon of a flow rate of 450 mL/min were mixed to form a mixed gas, and this mixed gas was used as the etching gas. Then, the etching gas was supplied into the chamber at a flow rate of 500 mL/min and circulated for 10 minutes to perform etching. The pressure inside the chamber during the circulation of the etching gas was set to 10 kPa, and the partial pressure of bromine pentafluoride gas was set to 1 kPa. Upon completion of the circulation of the etching gas, the heating of the stage was finished and the inside of the chamber was replaced with argon.

The content of hydrogen fluoride contained in the etching gas was measured by infrared spectroscopic analysis and found to be below 30 ppm by volume. The measurement conditions are as follows.

Measuring equipment: Nicolet iS5 (manufactured by Thermo Scientific)
Measurement temperature: 60° C.
Measurement pressure: 0.01 MPa
Window material: Calcium fluoride
Cumulative count: 8 times
Measurement wavelength range: 1200 to 4000 cm$^{-1}$
Peak wavelength used to measure the content of hydrogen fluoride: 3877 cm$^{-1}$ The chamber was opened, the etching object was taken out, and the film thickness of the silicon nitride film was measured. The film thickness of the silicon nitride film was measured using an F20 film thickness measurement system manufactured by Filmetrics Corporation. The conditions for measuring the film thickness are as follows:

Measurement pressure: Atmospheric pressure (101.3 kPa)
Measurement temperature: 28° C.
Measurement atmosphere: In the atmosphere
Measurement wavelength range of silicon dioxide: 200 to 1000 nm
Measurement wavelength range of silicon nitride: 900 to 1700 nm The etching rate of the silicon nitride was calculated by substituting the film thickness measurement results into the following expression. The results are shown in Table 1.

Etching rate (nm/min)={Film thickness (nm) of silicon nitride film before etching−Film thickness (nm) of silicon nitride film after etching}/Etching time (min)

TABLE 1

|  | Etching object | Temp. of stage (° C.) | Etching gas | | Volume ratio*) | Pressure (kPa) | | Etching time (min) | Etching rate (nm/min) |
|---|---|---|---|---|---|---|---|---|---|
|  |  |  | Halogen fluoride | Inert gas |  | Inside chamber | Halogen fluoride (partial pressure) |  |  |
| Example 1 | Silicon nitride | 155 | $BrF_5$ | Ar | 10/90 | 10 | 1 | 10 | 1.0 |
| Example 2 | Silicon nitride | 220 | $BrF_5$ | Ar | 10/90 | 10 | 1 | 10 | 8.5 |
| Example 3 | Silicon nitride | 300 | $BrF_5$ | Ar | 10/90 | 10 | 1 | 10 | 23.0 |
| Example 4 | Silicon nitride | 500 | $BrF_5$ | Ar | 10/90 | 10 | 1 | 10 | 72.3 |
| Example 5 | Silicon nitride | 300 | $BrF_5$ | — | 100/0 | 10 | 10 | 10 | 88.3 |
| Example 6 | Silicon nitride | 300 | $BrF_5$ | $N_2$ | 10/90 | 10 | 1 | 10 | 4.2 |
| Example 7 | Silicon nitride | 300 | $BrF_5$ | Ar + $N_2$ | 10/90 | 10 | 1 | 10 | 5.8 |
| Example 8 | Silicon nitride | 300 | $BrF_5$ | Ar | 10/90 | 50 | 5 | 10 | 93.7 |
| Example 9 | Silicon nitride | 300 | $BrF_5$ | Ar | 10/90 | 0.5 | 0.05 | 10 | 4.7 |
| Example 10 | Silicon nitride | 300 | $IF_7$ | Ar | 10/90 | 10 | 1 | 10 | 6.1 |
| Example 11 | Silicon nitride | 300 | $BrF_5$ | Ar | 3/97 | 10 | 0.3 | 10 | 5.7 |
| Example 12 | Silicon nitride | 100 | $BrF_5$ | Ar | 10/90 | 10 | 1 | 100 | 0.08 |
| Comparative example 1 | Silicon dioxide | 300 | $BrF_5$ | Ar | 10/90 | 10 | 1 | 100 | 0.16 |
| Comparative example 2 | Silicon dioxide | 500 | $BrF_5$ | Ar | 10/90 | 10 | 1 | 10 | 1.2 |
| Comparative example 3 | Photoresist | 300 | BrF5 | Ar | 10/90 | 10 | 1 | 10 | 1.6 |
| Comparative example 4 | Amorphous carbon | 300 | $BrF_5$ | Ar | 10/90 | 10 | 1 | 10 | 0.5 |

*)Volume ratio between halogen fluoride and inert gas; e.g., "halogen fluoride:inert gas = 10:90" is denoted by "10/90."

Example 2

An etching object was etched in the same manner as in Example 1 except that the temperature of the stage was set to 220° C., and the etching rate of the silicon nitride was calculated. The results are shown in Table 1.

Example 3

An etching object was etched in the same manner as in Example 1 except that the temperature of the stage was set to 300° C., and the etching rate of the silicon nitride was calculated. The results are shown in Table 1.

Example 4

An etching object was etched in the same manner as in Example 1 except that the temperature of the stage was set to 500° C., and the etching rate of the silicon nitride was calculated. The results are shown in Table 1.

Example 5

An etching object was etched in the same manner as in Example 1 except that no inert gas was mixed in an etching gas, the etching gas was composed only of bromine pentafluoride, and the temperature of the stage was set to 300° C., and the etching rate of the silicon nitride was calculated. The results are shown in Table 1.

Example 6

An etching object was etched in the same manner as in Example 1 except that a nitrogen gas was used as an inert gas and the temperature of the stage was set to 300° C., and the etching rate of the silicon nitride was calculated. The results are shown in Table 1.

Example 7

An etching object was etched in the same manner as in Example 1 except that a mixed gas of a nitrogen gas and argon was used as an inert gas and the temperature of the stage was set to 300° C., and the etching rate of the silicon nitride was calculated. The results are shown in Table 1. The mixing ratio of the nitrogen gas and argon is 50% by volume to 50% by volume.

Example 8

An etching object was etched in the same manner as in Example 1 except that the pressure inside the chamber was set to 50 kPa and the temperature of the stage was set to 300° C., and the etching rate of the silicon nitride was calculated. The results are shown in Table 1.

Example 9

An etching object was etched in the same manner as in Example 1 except that the pressure inside the chamber was set to 0.5 kPa and the temperature of the stage was set to 300° C., and the etching rate of the silicon nitride was calculated. The results are shown in Table 1.

Example 10

An etching object was etched in the same manner as in Example 1 except that halogen fluoride was replaced by iodine heptafluoride and the temperature of the stage was set to 300° C., and the etching rate of the silicon nitride was calculated. The results are shown in Table 1.

Example 11

An etching object was etched in the same manner as in Example 1 except that the flow rate of a bromine pentafluoride gas was set to 30 mL/min, the flow rate of an argon gas was set to 970 mL/min, and the temperature of the stage was set to 300° C., and the etching rate of the silicon nitride was calculated. The results are shown in Table 1.

Example 12

An etching object was etched in the same manner as in Example 1 except that the temperature of the stage was set to 100° C. and the etching time was set to 100 minutes, and the etching rate of the silicon nitride was calculated. The results are shown in Table 1.

Comparative Example 1

An etching object was etched in the same manner as in Example 1 except that a square silicon substrate of 2 inches per side which has a silicon dioxide film with a film thickness of 142 nm deposited thereon was used as an etching object, the temperature of the stage was set to 300° C., and the etching time was set to 100 minutes, and the etching rate of the silicon dioxide was calculated by substituting the film thickness measurement results into the same expression as the above expression. The results are shown in Table 1. The etching object was manufactured by KST World Corporation.

Comparative Example 2

An etching object was etched in the same manner as in Comparative example 1 except that the temperature of the stage was set to 500° C., and the etching rate of the silicon dioxide was calculated. The results are shown in Table 1.

Comparative Example 3

An etching object was etched in the same manner as in Example 1 except that a square silicon substrate of 2 inches per side which was coated with photoresist (TSCR (registered trademark) manufactured by Tokyo Ohka Kogyo Co., LTD.), exposed and cured to form a photoresist film having a film thickness of 130 nm was used as the etching object and the temperature of the stage was set to 300° C., and the etching rate of the photoresist was calculated. The results are shown in Table 1.

Comparative Example 4

An etching object was etched in the same manner as in Example 1 except that a square silicon substrate of 2 inches per side which was coated with amorphous carbon (manufactured by Merck) to form an amorphous carbon film having a film thickness of 150 nm was used as the etching object and the temperature of the stage was set to 300° C., and the etching rate of the amorphous carbon was calculated. The results are shown in Table 1.

Example 13

Etching objects were etched in the same manner as in Example 1 except that both the etching object used in Example 1 and the etching object used in Comparative example 1 were used as the etching objects and these two etching objects were placed side by side on the stage in the chamber, and the temperature of the stage was set to 300° C., and the etching rates and the etching selectivity ratio of the silicon nitride and the silicon dioxide were calculated. The etching selectivity ratio is (Etching rate of silicon nitride)/(Etching rate of silicon dioxide). The results are shown in Table 2.

Example 14

Etching objects were etched in the same manner as in Example 13 except that an etching gas contained 1000 ppm by volume of hydrogen fluoride (more specifically, a mixed gas formed by mixing a bromine pentafluoride gas of a flow rate of 50 mL/min and argon of a flow rate of 450 mL/min and further adding 1000 ppm by volume of hydrogen fluoride thereto was used as the etching gas), and the etching rates of the silicon nitride and the silicon dioxide were calculated. The results are shown in Table 2.

Comparative Example 5

Etching objects were etched in the same manner as in Example 13 except that the pressure inside the chamber was set to 100 kPa, and the etching rates of the silicon nitride and the silicon dioxide were calculated. The results are shown in Table 2.

TABLE 2

| | | Temp. of stage (° C.) | Etching gas | | | Pressure (kPa) | | Etching time (min) | Etching rate (nm/min) | | Etching selectivity ratio |
| | Etching object | | Halogen fluoride | Inert gas | Volume ratio[1] | Inside chamber | Halogen fluoride (partial pressure) | | Silicon nitride | Silicon dioxide | |
| --- | --- | --- | --- | --- | --- | --- | --- | --- | --- | --- | --- |
| Example 13 | Silicon nitride Silicon dioxide | 300 | BrF$_5$ | Ar | 10/90 | 10 | 1 | 10 | 8.5 | 0.1 | 85.0 |
| Example 14 | Silicon nitride Silicon dioxide | 300 | BrF$_5$ | Ar | 10/90[2] | 10 | 1 | 10 | 19.0 | 3.2 | 5.9 |
| Comparative example 5 | Silicon nitride Silicon dioxide | 300 | BrF$_5$ | Ar | 10/90 | 100 | 10 | 10 | 54.2 | 12.0 | 4.5 |

[1]Volume ratio between halogen fluoride and inert gas; e.g., "halogen fluoride:inert gas = 10:90" is denoted by "10/90."
[2]1000 ppm by volume of hydrogen fluoride is contained in addition to halogen fluoride and inert gas.

From the results of Examples 1 to 4, it is seen that the etching rate of the silicon nitride increases as the temperature of the stage increases.

From the result of Example 5, it is seen that the etching rate of the silicon nitride is faster in the case where no inert gas is added than in the case where an inert gas is added. This is considered to be because an increase in the partial pressure of the halogen fluoride inside the chamber led to an increase in the frequency of contact between the surface of the silicon nitride film and the halogen fluoride, causing the etching to quickly proceed.

From the results of Examples 6 and 7, it is seen that the results are the same whether a nitrogen gas or a mixed gas of a nitrogen gas and argon is used as the inert gas or only argon is used as the inert gas. These results suggested that the type of an inert gas hardly affects the etching performance. Further, it was found from the result of Example 11 that the etching rate decreases as the proportion of the inert gas in the etching gas increases.

From the results of Examples 8 and 9, it is seen that whereas the etching rate of the silicon nitride increases as the pressure inside the chamber increases, the etching rate of the silicon nitride decreases as the pressure inside the chamber decreases. These results suggested that the etching rate increases as the partial pressure of the halogen fluoride inside the chamber increases, and the etching rate decreases as the partial pressure decreases.

From the result of Example 10, it is seen that the silicon nitride can be etched even when an etching gas containing iodine heptafluoride is used to perform etching.

From the results of Comparative examples 1 to 4, it is seen that the etching rates of the silicon dioxide, the photoresist, and the amorphous carbon are extremely slow even if the etching is performed by using an etching gas containing bromine pentafluoride.

From the result of Example 12, it is seen that, at a temperature of 100° C. or less, when etching is performed by using an etching gas containing bromine pentafluoride, the etching is possible even though the etching rate of the silicon nitride is slow.

From the result of Example 13, it is seen that the silicon nitride is selectively etched without any problem even if the silicon nitride and the silicon dioxide are present in the same chamber.

From the result of Example 14, it is seen that, when the content of hydrogen fluoride in the etching gas is 1000 ppm by volume, etching is possible even though the etching selectivity ratio between the silicon nitride and the silicon dioxide decreases.

From the result of Comparative example 5, it is seen that the etching selectivity ratio between the silicon nitride and the silicon dioxide significantly decreases when the pressure inside the chamber exceeds 80 kPa.

Example 15

Figure 2:
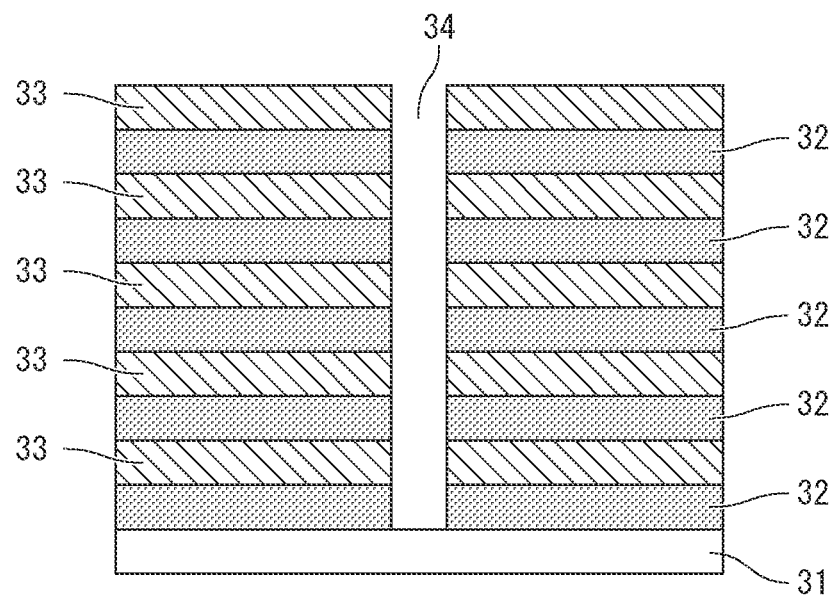
FIG. 2 is a diagram illustrating an etching object used in Examples 15 to 20.

An etching object used in Example 15 will be described with reference to FIG. 2. The etching object of FIG. 2 has a structure in which five layers of silicon nitride films 32, each having a film thickness of 100 nm, and five layers of silicon dioxide films 33, each having a film thickness of 100 nm, are alternately stacked on a silicon substrate 31. In addition, the etching object of FIG. 2 has a through hole 34 having a diameter of 100 nm that penetrates through the five layers of the silicon nitride films 32 and the five layers of the silicon dioxide films 33 in the stacking direction.

The etching object was placed on a stage of an etching apparatus having substantially the same configuration as that of the etching apparatus of FIG. 1, and the temperature of the stage was increased to 300° C. Subsequently, a bromine pentafluoride gas of a flow rate of 10 mL/min and argon of a flow rate of 90 mL/min were mixed to form a mixed gas, and this mixed gas was used as the etching gas. Then, this etching gas was supplied into a chamber and circulated for 10 minutes to perform etching. The pressure inside the chamber during the circulation of the etching gas was set to 10 kPa, and the partial pressure of the bromine pentafluoride gas was set to 1 kPa. Upon completion of the circulation of the etching gas, the heating of the stage was finished and the inside of the chamber was replaced with argon.

The chamber was opened, and the etching object was taken out. In the etching object that has been etched, portions of the silicon nitride films 32 that were exposed to the inner surface of the through hole 34 were etched, and in particular, the silicon nitride films 32 were preferentially etched, as compared with the silicon dioxide films 33, so that the inner surface of the through hole 34 partly expanded outward in the radial direction. Portions of the silicon dioxide films 33 that were exposed to the inner surface of the through hole 34 were not etched, thus forming a structure in which the end portions of the silicon dioxide films 33 protrude into the through hole 34.

The etching object that had been taken out was cut and the cross sections of the five layers of the silicon nitride films 32 were analyzed by a scanning electron microscope. More specifically, for each of the five layers of the silicon nitride films 32, the radial distance between the portion of the silicon nitride film 32 exposed to the inner surface of the through hole 34 and the portion of the silicon dioxide film 33 exposed to the inner surface of the through hole 34 was measured. In other words, the inner surface of the through hole 34 expands outward in the radial direction due to etching, causing the radius of the through hole 34 to increase, and the difference in the radius was measured. Then, the measured difference was divided by etching time thereby to calculate the relative etching rate of the silicon nitride with respect to the silicon dioxide.

Then, the average value and the standard deviations of the etching rates of the five layers of the silicon nitride films 32 were calculated to evaluate whether the relative etching rate in the in-plane direction of the silicon nitride films 32 (in the direction parallel to the surfaces of the silicon nitride films 32) changed, depending on the positions of the silicon nitride films 32 in the stacking direction, and to evaluate the uniformity of the relative etching rate. The results are shown in Table 3.

TABLE 3

| | Temp. of stage (° C.) | Etching gas | | | Pressure (kPa) | | Etching time (min) | Average value of etching rate (nm/min) | Standard deviation |
|---|---|---|---|---|---|---|---|---|---|
| | | Halogen fluoride | Inert gas | Volume ratio[*] | Inside chamber | Halogen fluoride (partial pressure) | | | |
| Example 15 | 300 | BrF$_5$ | Ar | 10/90 | 10 | 1 | 10 | 5.2 | 0.7 |
| Example 16 | 500 | BrF$_5$ | Ar | 10/90 | 10 | 1 | 10 | 67.4 | 5.2 |
| Example 17 | 300 | BrF$_5$ | — | 100/0 | 10 | 10 | 10 | 63.6 | 5.3 |
| Example 18 | 300 | BrF$_5$ | Ar | 10/90 | 50 | 5 | 10 | 87.6 | 9.6 |
| Example 19 | 300 | BrF$_5$ | Ar | 10/90 | 0.5 | 0.05 | 10 | 5.1 | 0.4 |
| Example 20 | 300 | IF$_7$ | Ar | 10/90 | 10 | 1 | 10 | 6.5 | 0.5 |

[*]Volume ratio between halogen fluoride and inert gas; e.g., "halogen fluoride:inert gas = 10:90" is denoted by "10/90."

Examples 16 to 20

An etching object was etched in the same manner as in Example 15 except that any one of the temperature of the stage, the type of the halogen fluoride, whether an inert gas is used or not, the pressure inside the chamber, the partial pressure of the halogen fluoride, and etching time was changed as shown in Table 3, and the average value and the standard deviations of the etching rates of the silicon nitrides were calculated. The results are shown in Table 3.

From the results of Examples 15 to 20, it is seen that the etching rate of the silicon nitride increases as the temperature of the stage is increased or the partial pressure of the halogen fluoride is increased. Further, the ratio of the standard deviation of the etching rate with respect to the average value of the etching rate of the silicon nitride is approximately 7 to 13%, so that it is seen that the etching of the five layers of the silicon nitride films 32 proceeds substantially uniformly regardless of the positions of the silicon nitride films 32 in the stacking direction.

By making use of the characteristic that the etching of the silicon nitride films proceeds substantially uniformly regardless of the position in the stacking direction as described above, it is possible to forma structure in which, for example, the end portions of the silicon dioxide films protrude into the through hole. Such a structure is used, for example, as the structure of semiconductor elements such as a 3D-NAND flash memory. In other words, the present invention has technological significance in that the invention can be used for manufacturing, for example, semiconductor elements such as 3D-NAND flash memories.

REFERENCE SIGNS LIST 1 halogen fluoride gas supply unit
2 inert gas supply unit
3 halogen fluoride gas flow rate control unit
4 inert gas flow rate control unit
5 halogen fluoride gas supply pipe
6 inert gas supply pipe
7, 16 pressure gauge
10 chamber
11 stage
12 etching object
13 exhaust pipe
14 thermometer
15 vacuum pump
31 silicon substrate
32 silicon nitride film
33 silicon dioxide film
34 through hole

The invention claimed is:

1. An etching method for silicon nitride, comprising:
performing an etching step in which an etching object containing silicon nitride uses an etching gas, to etch the silicon nitride contained in the etching object under a pressure of 1 Pa to 80 kPa without using plasma,
wherein the etching gas consists of
i) a halogen fluoride only,
ii) a halogen fluoride and hydrogen fluoride, or
iii) a halogen fluoride, hydrogen fluoride and an inert gas,
wherein the halogen fluoride is at least one selected from among bromine trifluoride, bromine pentafluoride, iodine pentafluoride, and iodine heptafluoride,
wherein a content of the hydrogen fluoride contained in the etching gas is below 100 ppm by volume,
the etching object contains the silicon nitride and an etching-resistant material configured to suppress etching of the silicon nitride by the etching gas, and
the silicon nitride of the etching object is selectively etched by the etching gas.

2. The etching method for silicon nitride according to claim 1, wherein a temperature of the etching object is 155° C. to 500° C.

3. The etching method for silicon nitride according to claim 2, wherein the content of the halogen fluoride contained in the etching gas is equal to or more than 1% by volume.

4. The etching method for silicon nitride according to claim 1, wherein the content of the halogen fluoride contained in the etching gas is equal to or more than 1% by volume.

5. The etching method for silicon nitride according to claim 1, wherein the inert gas is at least one selected from among nitrogen gas, helium, argon, neon, krypton, and xenon.

6. The etching method for silicon nitride according to claim 1, wherein the etching-resistant material contains at least one selected from among silicon dioxide, photoresist, and amorphous carbon.

7. The etching method for silicon nitride according to claim 1, wherein an etching selectivity ratio is 10 or more, the etching selectivity ratio being a ratio of an etching rate of the silicon nitride to an etching rate of the etching-resistant material.

8. A production method for a semiconductor element for producing a semiconductor element by using the etching method for silicon nitride according to claim 1.

* * * * *